(12) United States Patent
Young et al.

(10) Patent No.: US 12,362,032 B2
(45) Date of Patent: Jul. 15, 2025

(54) ERROR DETECTION FOR A SEMICONDUCTOR DEVICE

(71) Applicant: Micron Technology, Inc., Boise, ID (US)

(72) Inventors: Matthew Young, Allen, TX (US); John E. Riley, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 350 days.

(21) Appl. No.: 17/889,369

(22) Filed: Aug. 16, 2022

(65) Prior Publication Data

US 2023/0395183 A1 Dec. 7, 2023

Related U.S. Application Data

(60) Provisional application No. 63/348,461, filed on Jun. 2, 2022.

(51) Int. Cl.
*G11C 29/52* (2006.01)
*G11C 7/10* (2006.01)
*G11C 29/00* (2006.01)

(52) U.S. Cl.
CPC ............ *G11C 29/52* (2013.01); *G11C 7/1039* (2013.01); *G11C 29/789* (2013.01)

(58) Field of Classification Search
CPC ...... G11C 29/52; G11C 7/1039; G11C 29/789
See application file for complete search history.

(56) References Cited

U.S. PATENT DOCUMENTS

| | | | |
|---|---|---|---|
| 7,900,100 B2 | 3/2011 | Gollub | |
| 9,864,654 B2 | 1/2018 | Vishne et al. | |
| 10,937,515 B1* | 3/2021 | He | G11C 17/18 |
| 2006/0010346 A1* | 1/2006 | Minemier | G01T 1/245 |
| | | | 714/E11.018 |
| 2016/0027529 A1* | 1/2016 | Hoefler | G11C 29/024 |
| | | | 365/154 |
| 2017/0256326 A1* | 9/2017 | You | G06F 11/0793 |
| 2021/0034446 A1* | 2/2021 | Shim | G06F 11/3034 |
| 2021/0124529 A1* | 4/2021 | Nishikawa | G11C 16/0483 |
| 2022/0164251 A1* | 5/2022 | He | G06F 11/1048 |
| 2022/0246201 A1* | 8/2022 | Kim | G11C 7/1063 |
| 2023/0343409 A1* | 10/2023 | Eichmeyer | G11C 29/787 |

* cited by examiner

*Primary Examiner* — Alexander Sofocleous
*Assistant Examiner* — Duy H Luong
(74) *Attorney, Agent, or Firm* — Brooks, Cameron & Huebsch, PLLC

(57) ABSTRACT

The present disclosure includes apparatus, methods, and systems for error detection for a semiconductor device. An apparatus includes a memory array, a detector array, and a detector coupled to the detector array. The detector is configured to detect an error in a portion of the detector array and output an output signal to memory components coupled to the detector array in response to detecting the error.

22 Claims, 8 Drawing Sheets

ERROR DETECTION FOR A SEMICONDUCTOR DEVICE

PRIORITY INFORMATION

This application claims the benefit of U.S. Provisional Application No. 63/348,461, filed on Jun. 2, 2022, then contents of which are incorporated herein by reference.

TECHNICAL FIELD

The present disclosure relates generally to memory devices, and more particularly, to an error detection for a semiconductor device.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

Errors in the memory of a memory device can cause the memory device to function improperly. One source of an error in the memory of a memory device can be a neutron strike. As used herein, the term "neutron strike" refers to the interaction between one or more neutrons and a component of the memory device. The component can include, but is not limited to, an array of memory cells, latches, and logic circuitry. The errors can include, but are not limited to, changing the memory address stored in a latch or flipping a data bit. A processor on or coupled to the memory device can include error correction code (ECC) circuitry to correct the errors. However, if the number of errors exceeds the ability of the ECC circuitry to correct the errors, the memory device may function improperly.

BRIEF DESCRIPTION OF THE DRAWINGS

FIGS. 5-1 and 5-2 are each schematic views of an error detection system for a semiconductor device in accordance with a number of embodiments of the present disclosure.

DETAILED DESCRIPTION

Figure 1:
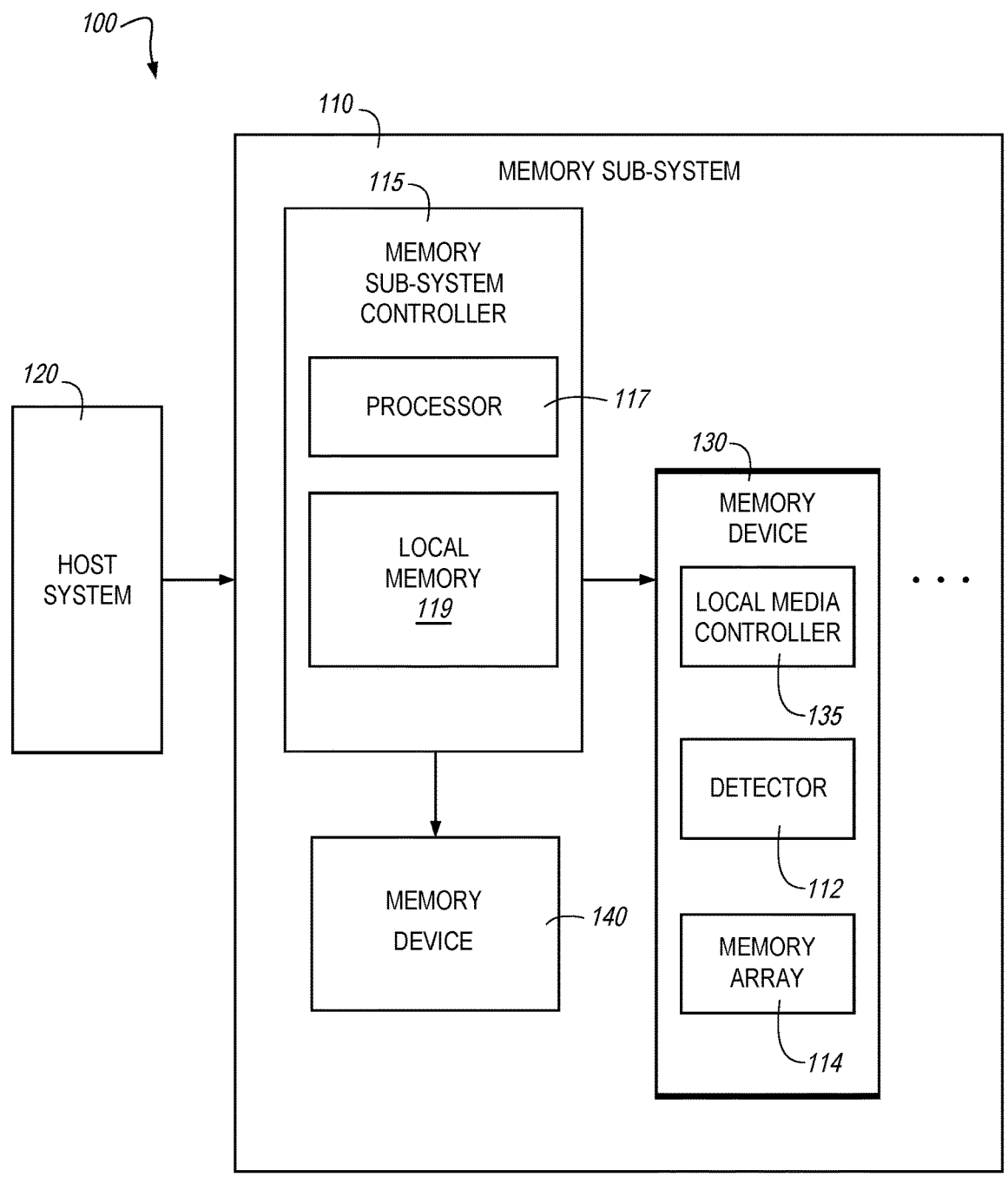
FIG. 1 illustrates an example computing system that includes a memory sub-system in accordance with a number of embodiments of the present disclosure

Embodiments of the present disclosure describe error detection for semiconductor devices. A detector for detecting an error can include a latch to store an undisturbed state which represents no neutron strike has occurred in this latch. A neutron strike in a portion of the detector array is indicative of memory errors which can cause a variety of errors in the memory device. If too many errors occur in the memory device, the memory device may not function properly.

In some approaches, latches may be configured to be more resistant to neutron strikes. A latch can include a plurality of transistors. The latch can be configured to be more resistant to neutron strikes based on the dimensions of the transistors. For example, increasing the width of a transistor can increase that detector's resistance to neutron strikes. Further, in some previous approaches, a fuse broadcast may be initiated while a memory device is powering up or when the memory device is reset. Therefore, if the portion of the array of memory cells that is experiencing an error is accessed after the fuse broadcast is initiated, the error may not be detected by the memory device.

In contrast, embodiments described herein are directed to a detector that is used to detect an error (e.g., a neutron strike) and output the detection of the error. As an example, some possible events that could take place upon detecting the error are initiating a fuse broadcast, reloading latch data, notifying the system by toggling the alert pin, writing a system accessible register, etc. As used herein, the term "fuse broadcast" refers to a signal that instructs the memory device to execute a redundancy command to reprogram the memory cell address affected by the neutron strike to a redundant memory cell. As stated earlier, the error can be caused by a neutron strike to a portion of a memory array. Further, embodiments described herein are directed to a detector that is configured to be more susceptible to neutron strikes than other components on the memory die. The detectors are more susceptible to neutron strikes because the latches in the detectors include transistors that are sized to be more susceptible to the neutron strikes. This approach allows a memory device to initiate a fuse broadcast in response to detecting an error instead of, in some examples, relying solely on initiating a fuse broadcast when the memory device is powering up or after the memory device is reset. Making the detector more susceptible to neutron strikes increases the probability that the detector will detect and respond to a neutron strike that occurs in a portion of the detector array. This approach also occupies less space than previous approaches because the latch comprises smaller transistors that are less resistant (e.g., more susceptible) to neutron strikes which allows normal latches to be used for redundancy information instead of dual interlocked storage cell (DICE) latches. As used herein, the term "normal latches" refers to latches that have a width of one hundred nanometers (nm) to three hundred nm.

The figures herein follow a numbering convention in which the first digit or digits correspond to the figure number of the drawing and the remaining digits identify an element or component in the drawing. Similar elements or components between different figures may be identified by the use of similar digits. For example, reference numeral 112 may reference element "12" in FIG. 1, and a similar element may be referenced as 312 in FIG. 3. Analogous elements within one figure may be referenced with a reference numeral followed by a hyphen and another numeral or a letter. For example, 203-1 may reference element 203-1 in FIGS. 2 and 203-2 may reference element 203-2, which may be analogous to element 203-1. Such analogous elements may be generally referenced without the hyphen and extra numeral or letter. For example, elements 203-1, 203-2, and 203-Q or other analogous elements may be generally referenced as 203.

FIG. 1 illustrates an example computing system 100 that includes a memory sub-system 110 in accordance with some embodiments of the present disclosure. The memory sub-system 110 can include media, such as one or more volatile memory devices (e.g., memory device 130), one or more non-volatile memory devices (e.g., memory device 140), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, the term "coupled to" or "coupled with" can refer to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via an interface (e.g., a physical host interface). Examples of an interface can include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), Universal Serial Bus (USB), or any other interface. The interface can be used to transmit data between the host system 120 and the memory sub-system 110. The interface can provide a way for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of volatile memory devices and/or non-volatile memory devices. The volatile memory devices can be, but are not limited to, random access memory (RAM), such as dynamic random access memory (DRAM) and synchronous dynamic random access memory (SDRAM).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130, 140 can be grouped as pages that can refer to a logical unit of the memory device used to store data.

A memory sub-system controller 115 (or controller 115 for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130, 140. The memory sub-system controller 115 can further include host interface (not pictured) circuitry to communicate with the host system 120 via a physical host interface (not pictured). The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package.

The memory sub-system 110 includes a detector 112 and memory array 114. In some embodiments, the detector 112 can be located in a periphery of the memory device 130, the local media controller 135, and/or the memory array (e.g., array of memory cells) 114. The detector 112 can be configured to detect an error in a portion of the memory array 114 and output an output signal to memory components coupled to the memory array 114 in response to detecting the error. In some embodiments, the output signal can initiate a fuse broadcast. In some embodiments, the fuse broadcast can be output in response to the detector 112 changing from a low logic state to a high logic state. The output signal can cause the apparatus to initiate a fuse broadcast, reload latch data, notify the system by toggling the alert pin, write a system accessible register, etc.

The memory array 114 can include redundant memory cells. As used herein, the term "redundant memory cells" refers to memory cells that can be mapped into the memory array 114 such that, if a memory cell in the memory array 114 fails, the data addressed to the failed memory cell can be saved to a functioning redundant memory cell corresponding to the address of the failed memory cell.

The detector 112 can initiate a fuse broadcast when the detector 112 changes from a low logic state to a high logic state. As used herein, the term "low logic state" refers to a state in which the detector 112 has not been hit by a neutron strike (e.g., has not received a current above a certain threshold value, among other possible indications that a neutron strike has not occurred). As used herein, the term "high logic state" refers to a state in which the detector 112 has been hit by a neutron strike (e.g., has received a current above a certain threshold value, among other possible indications that a neutron strike occurred). The detector 112 can be in a low logic state before a neutron strike occurs. The detector 112 can change from a low logic state to a high logic state in response to the neutron strike. In some embodiments, the detector 112 can initiate a fuse broadcast in response to changing from a low logic state to a high logic state or in response to the detector 112 detecting a neutron strike.

The detector 112 can include a latch that is formed from transistors that are more susceptible to neutron strikes. For example, the transistors can be sized to have a smaller width than other transistors such that the transistors have a smaller threshold voltage than transistors with a greater width. As an example, a smaller width could include anywhere within a range of 100-300 nanometers. This makes the transistors more susceptible to the energy that results from a neutron strike. Making the transistors more susceptible to neutron strikes on the array of memory cells increases the probability of the detector 112 changing from a low logic state to a high logic state when the neutron strike occurs. In response to the detector changing from a low logic state to a high logic state, the detector can initiate a fuse broadcast which broadcasts instructions to resolve the error caused by the neutron strike.

Figure 2:
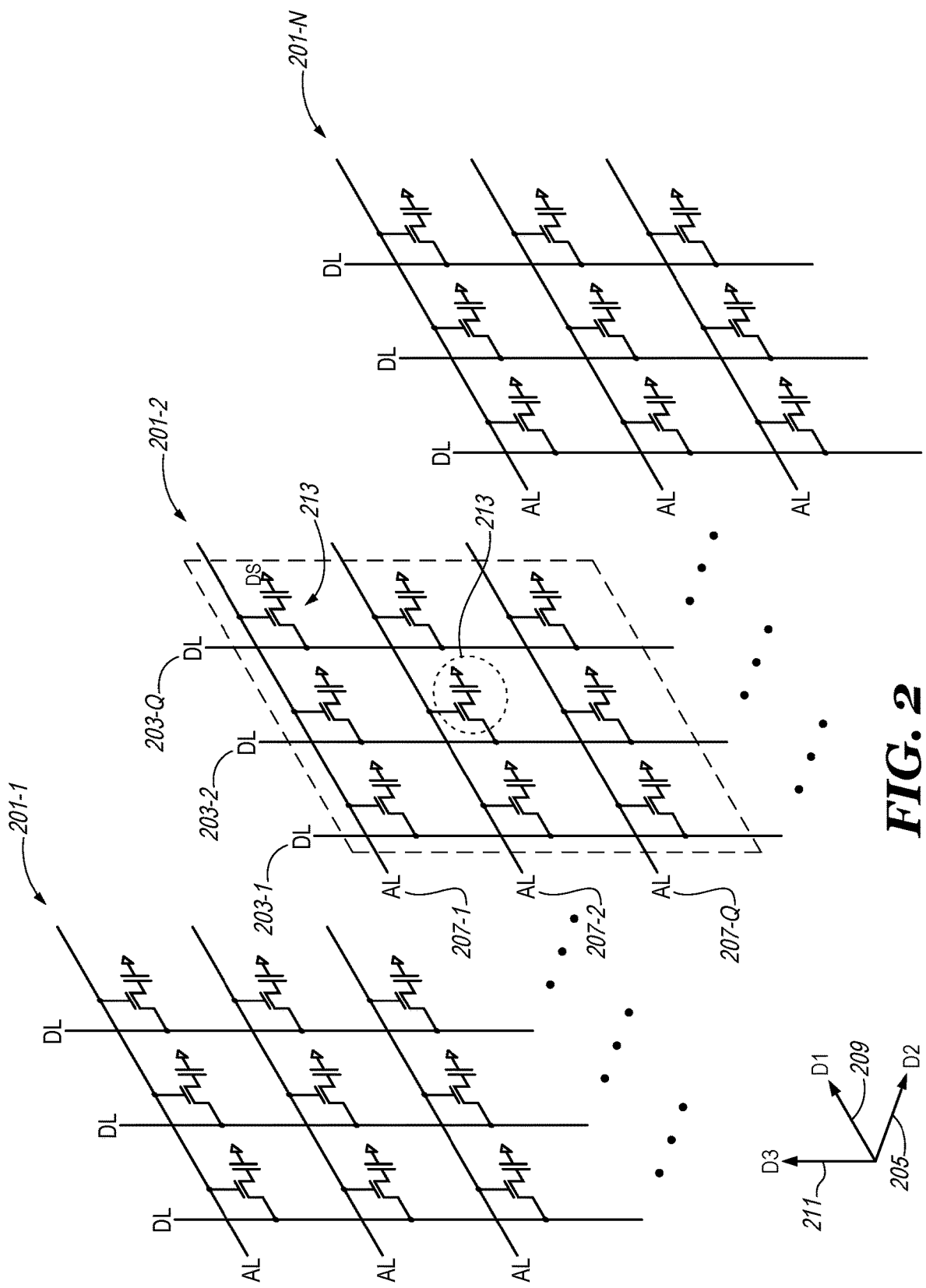
FIG. 2 is a schematic illustration of a vertical three-dimensional (3D) memory in accordance a number of embodiments of the present disclosure.

FIG. 2 is a schematic illustration of a vertical three-dimensional (3D) memory in accordance a number of embodiments of the present disclosure. FIG. 2 illustrates a cell array (e.g., array of memory cells) that may have a plurality of sub cell arrays 201-1, 201-2, . . . , 201-N. The sub cell arrays 201-1, 201-2, . . . , 201-N may be arranged along a second direction (D2) 205. Each of the sub cell arrays, e.g., sub cell array 201-2, may include a plurality of access lines 207-1, 207-2, . . . , 207-Q (which also may be referred to a word lines). Also, each of the sub cell arrays, e.g., sub cell array 201-2, may include a plurality of sense lines 203-1, 203-2, . . . , 203-Q (which also may be referred to as bit lines, data lines, or digit lines). In FIG. 2, the access lines 207-1, 207-2, . . . , 207-Q are illustrated extending in a first direction (D1) 209 and the sense lines 203-1, 203-2, . . . , 203-Q are illustrated extending in a third direction (D3) 211. According to embodiments, the first direction (D1) 209 and the second direction (D2) 205 may be considered in a horizontal ("X-Y") plane. The third direction (D3) 211 may be considered in a vertical ("Z") plane. Hence, according to embodiments described herein, the sense lines 203-1, 203-2, . . . , 203-Q are extending in a vertical direction, e.g., third direction (D3) 211.

A memory cell (e.g., 213) may include an access device (e.g., access transistor) and a storage node located at an intersection of each access line 207-1, 207-2, . . . , 207-Q and each sense line 203-1, 203-2, . . . , 203-Q. Memory cells may be written to, or read from, using the access lines 207-1, 207-2, . . . , 207-Q and sense lines 203-1, 203-2, . . . , 203-Q. The access lines 207-1, 207-2, . . . , 207-Q may conductively interconnect memory cells along horizontal rows of each sub cell array 201-1, 201-2, . . . , 201-N, and the sense lines 203-1, 203-2, . . . , 203-Q may conductively interconnect memory cells along vertical columns of each sub cell array 201-, 201-2, . . . , 201-N. One memory cell (e.g., 213) may be located between one access line (e.g., 207-2) and one sense line (e.g., 203-2). Each memory cell may be uniquely addressed through a combination of an access line 207-1, 207-2, . . . , 207-Q and a sense line 203-1, 203-2, . . . , 203-Q.

The access lines 207-1, 207-2, . . . , 207-Q may be or include conducting patterns (e.g., metal lines) disposed on and spaced apart from a substrate. The access lines 207-1, 207-2, . . . , 207-Q may extend in a first direction (D1) 209. The access lines 207-1, 207-2, . . . , 207-Q in one sub cell array, e.g., 201-2, may be spaced apart from each other in a vertical direction, e.g., in a third direction (D3) 211.

The sense lines 203-1, 203-2, . . . , 203-Q may be or include conductive patterns (e.g., metal lines) extending in a vertical direction with respect to the substrate (e.g., in a third direction (D3) 211). The sense lines in one sub cell array (e.g., 201-2) may be spaced apart from each other in the first direction (D1) 209.

A gate of a memory cell (e.g., memory cell 213) may be coupled to an access line (e.g., 207-2) and a first conductive node (e.g., first source/drain region) of an access device (e.g., transistor) of the memory cell 213 may be coupled to a sense line (e.g., 203-2). Each of the memory cells (e.g., memory cell 213) may be coupled to a storage node (e.g., capacitor). A second conductive node (e.g., second source/drain region), of the access device (e.g., transistor) of the memory cell 213 may be coupled to the storage node (e.g., capacitor). While first and second source/drain region reference are used herein to denote two separate and distinct source/drain regions, it is not intended that the source/drain region referred to as the "first" and/or "second" source/drain regions have some unique meaning. It is intended only that one of the source/drain regions is coupled to a sense line (e.g., 203-2), and the other may be coupled to a storage node.

Figure 3:
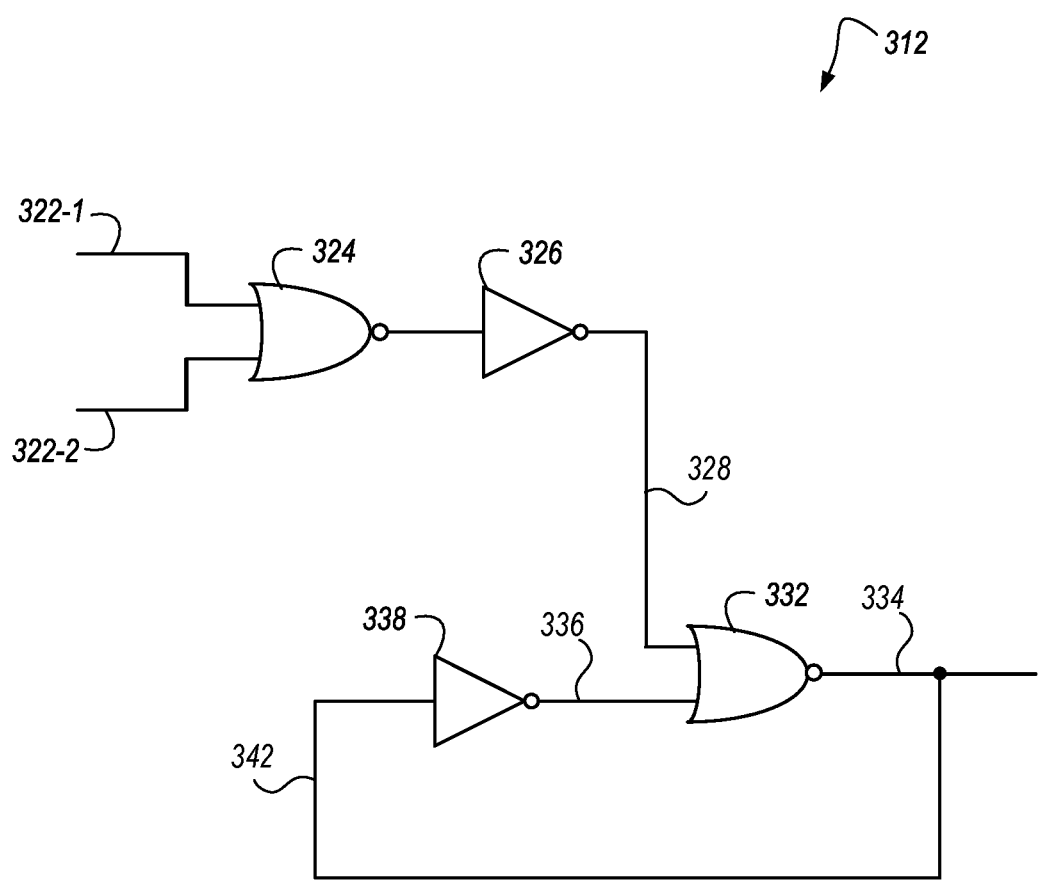
FIG. 3 is a schematic view of an error detector for a semiconductor device in accordance with a number of embodiments of the present disclosure.

FIG. 3 is a schematic view of an error detector 312 for a semiconductor device in accordance with a number of embodiments of the present disclosure. The detector 312 can include a NOR gate 324 coupled to an inverter 326 coupled to a NOR gate 332. An inverter 338 is also coupled to the NOR gate 332.

The NOR gate 324 can be a two-input NOR gate 324 that includes a first input 322-1 and a second input 322-2. The first input 322-1 and the second input 322-2 can be different signals. For example, the first input 322-1 can be a token signal and the second input 322-2 can be a power up reset signal.

In some embodiments, the detector 312 can start in a low logic state (e.g., off state indicated by a value of "0") or a high logic state (e.g., on state indicated by a value of "1") and change or continue to be in a low logic state in response to receiving the power up reset signal. In some embodiments, the power up reset signal would be high (e.g., have a voltage above a threshold value) and then go low (e.g., have a voltage below a threshold value) once the detector 312 is in a low logic state. If the detector 312 would have detected a neutron strike while the detector 312 was in a low logic state, the detector 312 would have changed to a high logic state in response to detecting the neutron strike.

Once the NOR gate 324 of the detector 312 receives an input signal (e.g., a power up reset signal or the token signal), the NOR gate 324 can change from a high logic state to a low logic state and output a signal to the inverter 326. In response to receiving the signal from the NOR gate 324, the inverter 326 can output a signal which is also a first input 328 of the two-input NOR gate 332. A second input 336 can be sent by an inverter 338. The NOR gate 332 can then output a signal 334 based on the first input 328 and the second input 336. The signal 334 can be input as an input signal 342 for the inverter 338. The inverter 338 can then output a signal as the second input 336 to NOR gate 332. The NOR gate 332 can send an output 334 to an external memory component. In some embodiments, the external memory component can include, but is not limited to, logic circuitry that couples outputs from additional detectors via OR gates, NOR gates, or a combination thereof (as described later in FIG. 5) external to the array of memory cells and/or an alert pin.

As used herein, the term "alert pin" refers to an output signal that indicates whether an error has occurred based on characteristics of the output signal. For example, if the alert pin has a high voltage, the alert pin might indicate that an error has not occurred. However, if the alert pin has a low voltage, the alert pin might indicate to the central processing unit (CPU) that an error has occurred. The alert pin can also instruct the CPU to execute an operation to correct the error indicated by the alert pin. The operation to correct the error can include, but is not limited to, initiating a fuse broadcast or other operations that involve reloading data in the array of memory cells. In some embodiments, all memory dies in a portion of the memory device may share an alert pin.

Figure 4:
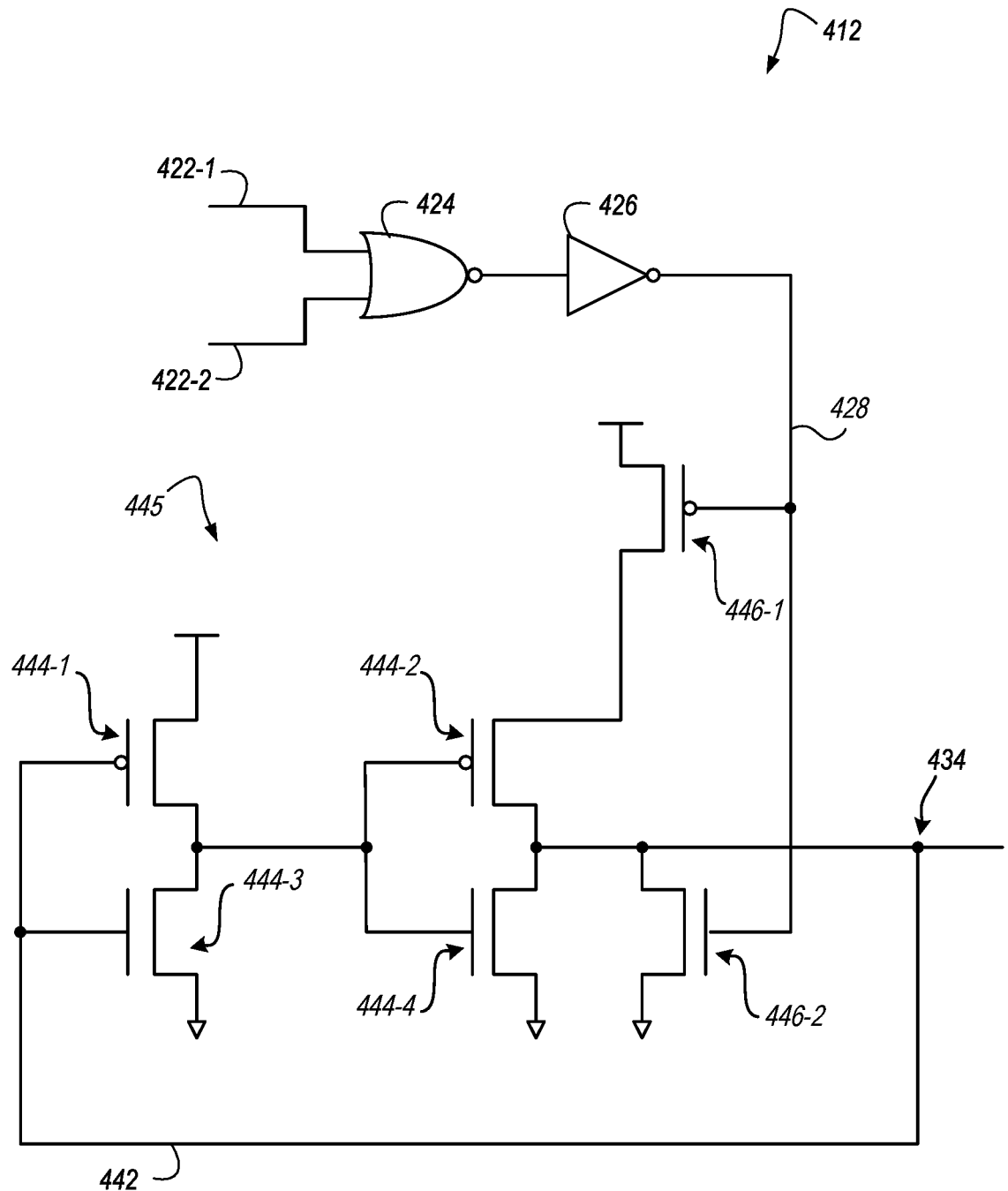
FIG. 4 is a schematic view of an error detector for a semiconductor device in accordance with a number of embodiments of the present disclosure.

FIG. 4 is a schematic view of an error detector 412 for a semiconductor device, in accordance with a number of embodiments of the present disclosure. The detector 412 has the same configuration as detector 312 in FIG. 3. However, the detector 412 illustrates the transistors that form the inverter (e.g., inverter 338 in FIG. 3) and the NOR gate (e.g., NOR gate 332 in FIG. 3).

The error detector 412 can include a two-input NOR gate 424 coupled to an inverter 426. As stated in FIG. 3, different types of input signals can be received by the NOR gate 424, such as signals 422-1 and 422-2. The input signals 422-1, 422-2 can include, but are not limited to, a powerup reset signal, and a token signal. In some embodiments, the latches 444 are reset in parallel when the input signal 422 is a powerup reset signal and the latches 444 are reset sequentially when the input signal 422 is a token signal. The NOR gate 424 can be coupled to an inverter 426 and output a signal to the inverter 426. The inverter 426 can be coupled to reset transistors and transistors that form a latch. The reset transistors can be transistors 446-1, 446-2 (individually or collectively referred to as reset transistors 446). The inverter 426 can output a signal 428, such as a reset signal, to the reset transistors 446. If a token signal that is input into the NOR gate 424, or a powerup reset signal that is input into the NOR gate 424, has a high voltage, the reset signal output by the inverter 426 can have a high voltage.

As similarly described in FIG. 3, the NOR gate 424 can change from a high logic state to a low logic state in response to receiving an input signal 422-1, 422-2 and then output a signal to the inverter 426. The inverter 426 can then output a signal 428 to the reset transistors 446. The reset transistors 446 can cause a signal 442 to be sent to the transistors 444-1, 444-2, 444-3, 444-4 (individually or collectively referred to as transistors 444). The transistors 444-2, 444-4 for a NOR gate (e.g., NOR gate 332 in FIG. 3) can then output a signal 434 to an external memory component.

The transistors 444 can form a latch 445. The latch 445 can be composed of an inverter (e.g., inverter 338 in FIG. 3) that is formed by transistors 444-1, 444-3 and a NOR gate (e.g., NOR gate 332 in FIG. 3) that is formed by transistors 444-2, 444-4. In some embodiments, the transistors 444 can be configured to be more susceptible to neutron strikes than other types of transistors and different-sized transistors. For example, the transistors 444 can be sized such that the length and width of the transistors 444 are smaller than the length of width of other transistors, such as the transistors of DICE latches. By using relatively small transistors, the latch 445 formed by transistors 444 can be more susceptible to neutron strikes than other latches, since other latches are intended to be resistant to neutron strikes. Transistors 444 can each be sized separately so that the latch 445 can be formed to be more susceptible to neutron strikes. This allows the latch 445 to more easily detect neutron strikes, and subsequently, output a signal that instructs a memory component to execute a redundancy command on the memory cells that may experience an error caused by the neutron strike.

In some embodiments, the error can be an uncorrectable error correction code (UECC) error. As used herein, the term "UECC error" refers to an ECC error in which the number of data bits that are experiencing an ECC error exceeds the ECC circuitry's capacity to correct the errors. UECC errors can negatively affect the operation of a memory device that is experiencing the UECC error.

Figures 1, 5:
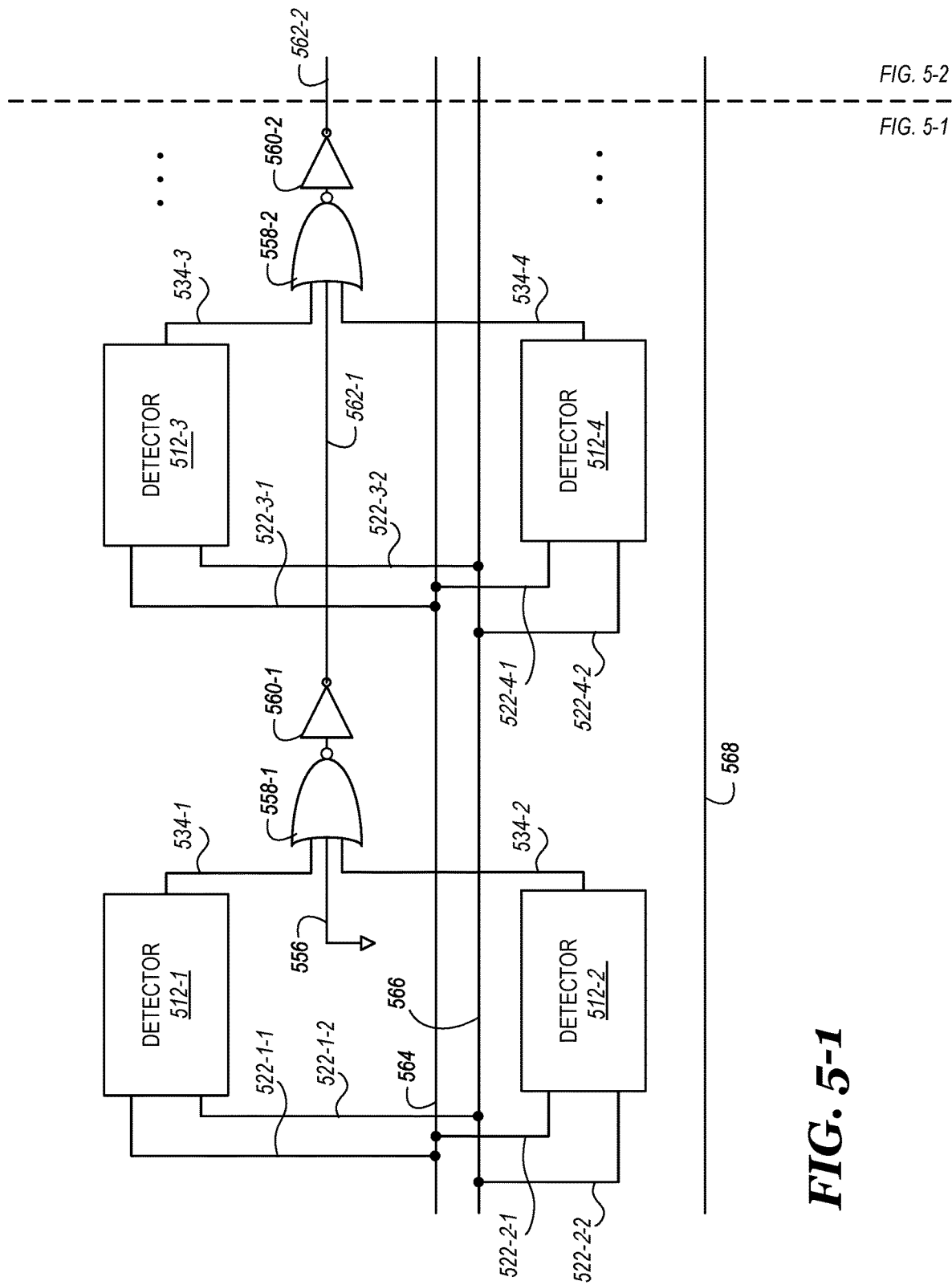
Figures 2, 5:
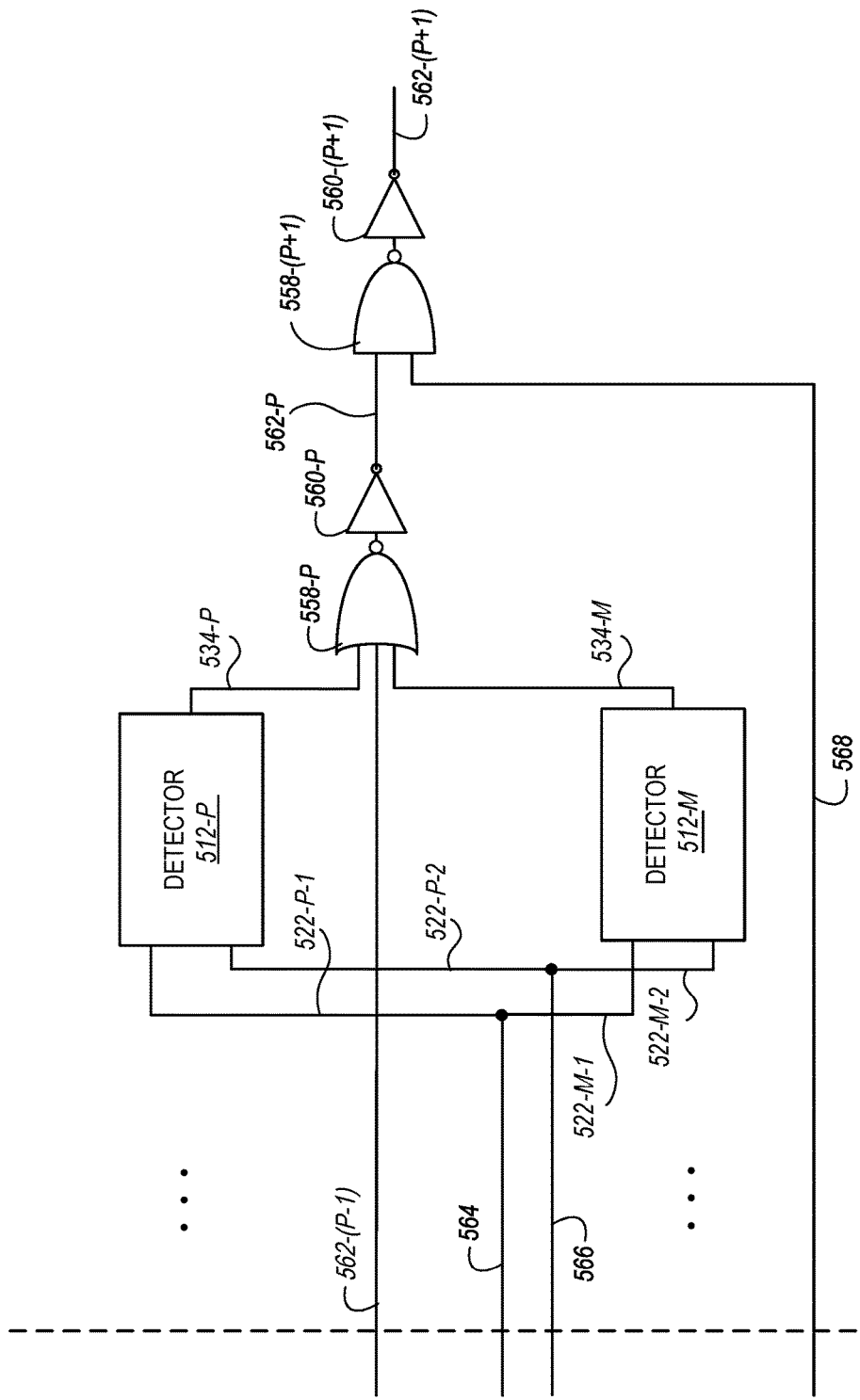

FIG. 5-1 is a schematic view of a first portion of an error detection system for a semiconductor device in accordance with a number of embodiments of the present disclosure. The second portion of the error detection system is described in FIG. 5-2. FIG. 5-1 illustrates a plurality of detectors 512-1, 512-2, . . . 512-P, . . . , 512-M (hereinafter referred to collectively as detectors 512). Each detector 512 can be coupled to a token I/O line 564 and a powerup reset I/O line 566. The detector 512-1 can be coupled to the token I/O line 564 via line 522-1-1, the detector 512-2 can be coupled to the token I/O line 564 via line 522-2-1, the detector 512-3 can be coupled to the token I/O line 564 via line 522-3-1, and the detector 512-4 can be coupled to the token I/O line 564 via line 522-4-1. As used herein, the term "line" refers to a wire used to transmit signals between memory components. The detector 512-1 can be coupled to the powerup reset I/O line 566 via line 522-1-2, the detector 512-2 can be coupled to the powerup reset I/O line 566 via line 522-2-2, the detector 512-3 can be coupled to the powerup reset I/O line 566 via line 522-3-2, and the detector 512-4 can be coupled to the powerup reset I/O line 566 via I/O line 522-4-2. The plurality of detectors 512 can each be coupled to an array of memory cells. In some embodiments, the plurality of detectors 512 can be configured to detect an error on a portion of the array of memory cells and output a signal in response to detecting the error.

As shown in FIG. 5-1, the plurality of detectors 512 can be coupled to each other via NOR gates 558-1, 558-2. The detector 512-1 can be coupled to the NOR gate 558-1 via the line 534-1 and the detector 512-2 can be coupled to the NOR 558-1 via the line 534-2. Line 556 couples the NOR gate 558-1 to ground. As described in FIG. 3, the detector 512-1 that is in a low logic state or a high logic state can change to or continue to be in a low logic state in response to receiving an input signal. In response to changing from a low logic state to a high logic state, the detector 512-1 can output a signal to the NOR gate 558-1. The output signal can be sent from the NOR gate 558-1 to the inverter 560-1 and output to the NOR gate 558-2. In this embodiment, the output of the inverter 560-1 becomes an input for the NOR gate 558-2 via line 562-1. The NOR gate 558-2 can output a signal to the inverter 560-2 and the inverter 560-2 can output a signal to subsequent NOR gates (e.g., NOR gate 558-P in FIG. 5-2) via lines 562-2 . . . 562-(P−1) (shown in FIG. 5-2). In some embodiments, the signal output can initiate a fuse broadcast.

In some embodiments, powering up the memory device can initiate a fuse broadcast that sends a token signal corresponding to a high logic state (e.g., a bit that has a logic value of "1") to each of the plurality of detectors 512. In other embodiments, the detector 512-1 can initiate a fuse broadcast if the detector 512-1 detects a neutron strike. In response to initiating the fuse broadcast, a token signal can be sent to the detector 512-1 via the line 522-1-1. The token signal can instruct the detector 512-1 to reinitialize a latch to clear the detection of the neutron strike in order to detect subsequent neutron strikes. After the detector 512-1 latches the data, the token signal can move to the other detectors 512 (e.g., detectors 512-2, 512-3, and 512-4, as well as detectors 512-P and 512-M in FIG. 5-2). In response to receiving a sequence of token signals, each of the detectors 512 can reset sequentially. As used herein, the term "reset sequentially" refers to resetting the detectors such that one detector is reset during a clock cycle and a detector that is reset subsequent to another detector during a subsequent clock cycle is adjacent that other detector.

In some embodiments, each of the detectors 512 receive the token signal during different clock cycles. For example, the detector 512-1 can receive the token signal during a first clock cycle and detector 512-3 can receive the token signal during a second clock cycle. Each subsequent detector can receive the token signal during subsequent clock cycles. In some examples, one detector 512 will receive the token signal per each clock cycle. Although only one detector 512 receives the token signal per each clock cycle, the token signal travels around the entire memory die that includes each of the detectors 512 during each clock cycle via the I/O line 564. In some embodiments, the number of bits that comprise the token signal can correspond to the number of detectors 512 on the memory die. For example, if there are thirty-two (32) detectors on the memory die, the token signal will comprise 32 bits. One bit of the token signal can separate from the rest of the bits and travel to a detector 512 during each clock cycle of a fuse broadcast.

In some embodiments, the token signal resets a detector 512 during a clock cycle. For example, a token signal can reset the detector 512-1 during the clock cycle in which the detector 512-3 receives the token signal. Since one detector 512 is reset per clock cycle, each detector 512 can be reset individually. By resetting the detectors 512, the token signal clears the latch of each detector 512 because, after the change from a high logic state back to a low logic state, the power up reset signal will stay low until the memory die loses power. Therefore, each detector 512 is reset so that the detector 512 is able to be in a low logic state or high logic state and change to or continue to be in a low logic state in response to a subsequent input.

In some embodiments, subsequent detectors 512 downstream will receive the token signal after a detector 512 initiates a fuse broadcast but previous detectors 512 upstream will not receive the token signal after a detector 512 initiates a fuse broadcast. For example, if detector 512-1 initiates the fuse broadcast, every other detector shown in FIGS. 5-1 and 5-2 will receive the token signal during subsequent clock cycles because detector 512-1 is the first detector 512 in the plurality of detectors 512. However, if detector 512-3 initiates the fuse broadcast, every subsequent detector 512 will receive the token signal but detector 512-1 will not receive the token signal. As described later in FIG. 5-2, if any of the detectors 512 receive the token signal, the plurality of detectors 512 will output a signal to an external memory component that indicates that an error has occurred.

In some embodiments, the fuse broadcast can broadcast a redundancy command to the detectors 512. As used herein, the term "redundancy command" refers to a message that indicates that data that is addressed to a defective memory cell is to be diverted to a redundant memory cell that corresponds to the address of the defective memory cell. In some embodiments, the redundancy command can include at least one of outputting an output signal to an alert pin, initiating a fuse broadcast, incrementing a counter, or writing a register that is accessible to the host. In some embodiments, the host can read the register to determine whether a neutron strike was detected. Further, in some embodiments, the counter can be incremented in response to detecting a neutron strike and the host can read the counter to determine the number of neutron strikes that have occurred. A memory cell can be defective for a variety of reasons including, but not limited to, process defects. Each detector 512 can have a separate redundancy command. In some embodiments, the redundancy command can be implemented using a redundancy match latch. The redundancy match latch is a latch that stores the address of memory cells that correspond to redundant memory cells. The redundancy match latch can be located in a memory bank and can compare the address of incoming data to the address stored in the redundancy match latch. If the address of the incoming data matches the address stored in the redundancy match latch, the redundant memory cell location will be turned on and the data will be diverted to the redundant memory cell location. In some embodiments, the data bus that transfers data to the memory die can be shared across all redundancy match latches. The redundancy match latch can be programmed to store a memory address after the memory cells that correspond to that memory address have been determined to be defective. The memory cell can be determined to be defective through testing the memory cell and determining that the memory cell does not meet process targets. The memory die can include a plurality of redundancy match latches stored in a redundancy match latch area.

In some embodiments, the memory die can include a fuse. If the fuse is blown (e.g., the fuse changed from a conductive state to a non-conductive state in response to receiving a current higher than a predetermined value), a redundancy match latch can store the address that corresponds to the blown fuse and compare it to the address of incoming data. If the address corresponding to the blown fuse matches the address of the incoming data, the incoming data can be diverted to redundant memory cells corresponding to the address. In some embodiments, the redundancy match latch will not store the address corresponding to the blown fuse if the redundant memory cells corresponding to that redundancy match latch are not programmed for use.

FIG. 5-2 is a schematic view of a second portion of an error detection system for a semiconductor device, in accordance with a number of embodiments of the present disclosure. FIG. 5-2 includes detector 512-P, which is coupled to NOR gate 558-P via line 534-P, and detector 512-M, which is coupled to NOR gate 558-P via line 534-M. The NOR gate 558-P can be coupled to inverter 560-P and inverter 560-P can be coupled to NAND gate 558 (P+1). The NAND gate 558 (P+1) can be coupled to inverter 560 (P+1).

As similarly described in FIG. 5-1, the detectors 512-P and 512-M can receive a token signal through lines 522-P–1 and 522-M–1, respectively, in response to the initiation of a fuse broadcast. During the clock cycle in which a token signal changes either detector 512-P or detector 512-M from a high logic state to a low logic state, or the detectors 512-P and 512-M are in a low logic state before the token signal is applied, the respective detector 512 is initialized for detecting a neutron strike.

Once a fuse broadcast is complete, the inverter 560 (P+1) can output a signal via line 562 (P+1). The output signal can either be a signal corresponding to a high logic state or a low logic state based on the logic state of the signal output by the NAND gate 558 (P+1). The signal output by the NAND gate 558 (P+1) depends on the input signals received via lines 562-P and 568. The line 562 (P+1) can output a signal to a memory component that is external to the plurality of detectors 512. For example, the line 562-(P+1) can output a signal to an alert pin, as well as other memory components.

In some embodiments, if a fuse broadcast is currently in progress, a subsequent fuse broadcast will not be initiated until the current fuse broadcast is complete. For example, if a neutron strike is detected while a fuse broadcast is currently in progress, a subsequent fuse broadcast to address the neutron strike will be initiated when the current fuse broadcast is completed. However, if the detector that detects the neutron strike during the fuse broadcast has not yet been reset, that detector will be reset during the current fuse broadcast and, therefore, a subsequent fuse broadcast will not be initiated to address the subsequent neutron strike. The line 568 can transmit the signal that indicates whether a current fuse broadcast is in progress.

Figure 6:
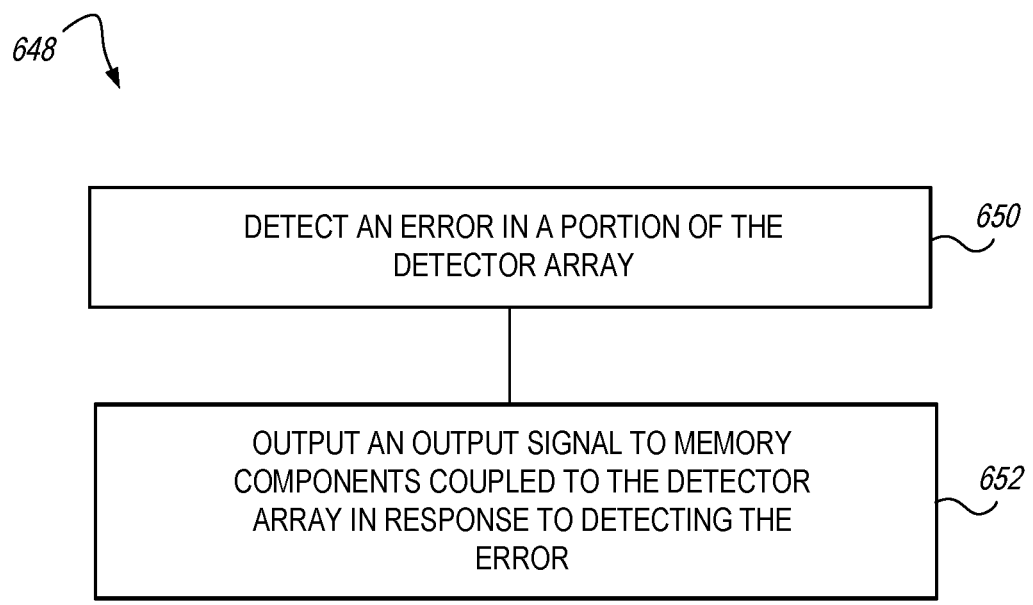
FIG. 6 is a flow diagram for an example method for error detection for a semiconductor device in accordance with a number of embodiments of the present disclosure.

FIG. 6 is a flow diagram for an example method for error detection for a semiconductor device in accordance with a number of embodiments of the present disclosure. The method 648 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 648 is performed by using the detector 112 and/or corresponding elements of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At step 650, the method 648 includes detecting an error in a portion of the detector array. As stated above, the error can be a neutron strike to the detector array. The memory cells in the portion of the detector array that experienced the neutron strike may be defective after experiencing the neutron strike. The detector that corresponds to that portion of the detector array can detect the neutron strike.

At step 652, the method 648 includes outputting an output signal to memory components coupled to the detector array in response to detecting the error. In some embodiments, the output signal can be a fuse broadcast. The fuse broadcast can instruct fuse match latches to execute a redundancy command if the detector that has received the fuse broadcast during the current clock cycle corresponds to a portion of the detector array that experienced a neutron strike. Further, the token signal can instruct the detector to reinitialize a latch, in the clock cycle that is subsequent to the clock cycle in which the latch received the fuse broadcast, to clear the detection of the neutron strike in order to detect subsequent neutron strikes.

Figure 7:
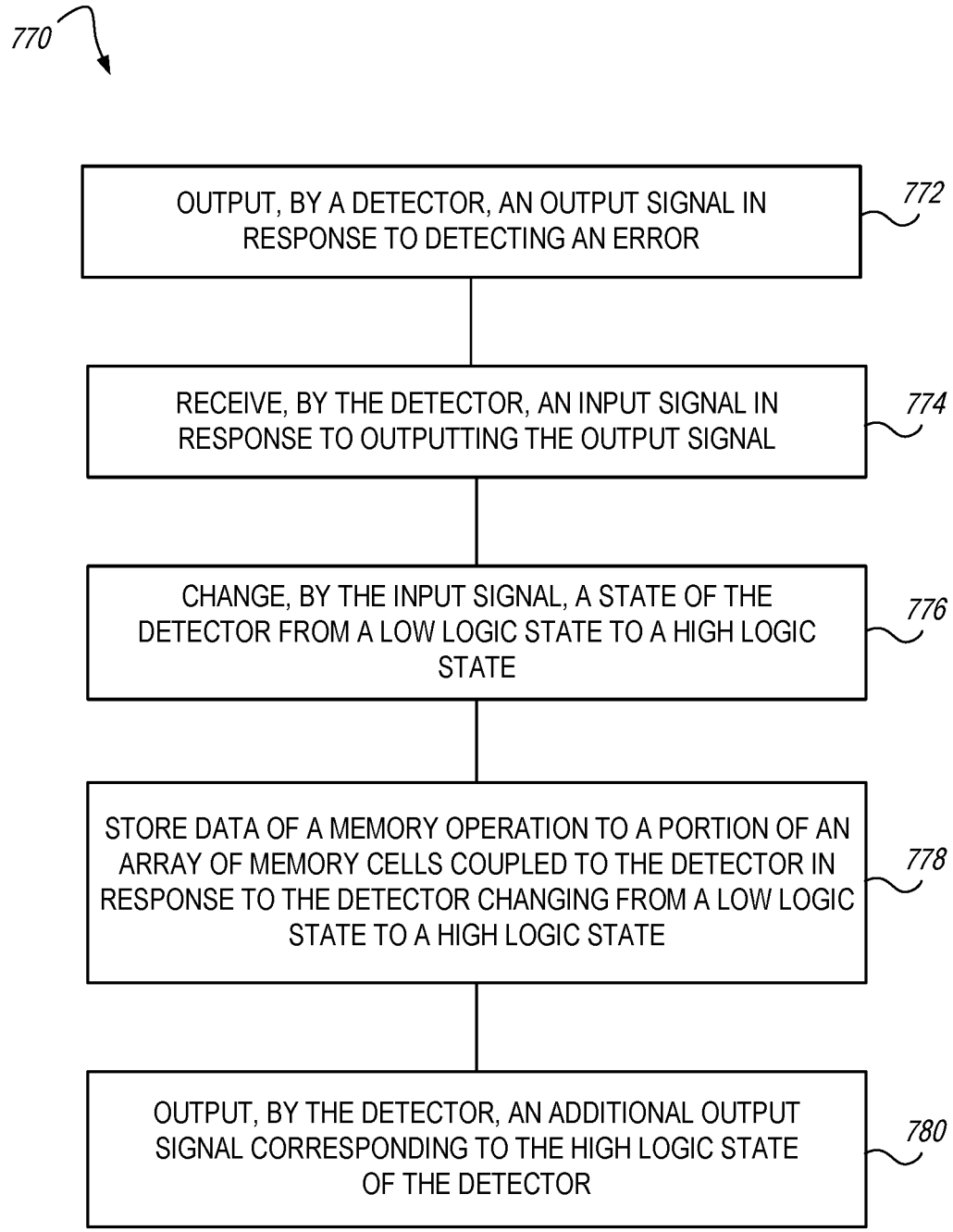
FIG. 7 is a flow diagram for an example method for error detection for a semiconductor device in accordance with a number of embodiments of the present disclosure.

FIG. 7 is a flow diagram for an example method 770 for error detection for a semiconductor device in accordance with a number of embodiments of the present disclosure. The method 770 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 770 is performed by using the detector 112 and/or corresponding elements of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At step 772, the method 770 includes outputting, by a detector, an output signal in response to detecting an error. In some embodiments, detecting the error can include the detector receiving an input signal, such as a neutron strike to memory cells that correspond to the detector. In some embodiments, the output signal can initiate a fuse broadcast.

At step 774, the method 770 can include receiving, by the detector, an input signal in response to outputting the output signal. In some embodiments, the input signal can be a token signal that is sent to the detector as a result of initiating the fuse broadcast. At step 776, the method 770 can include changing, by the input signal, a state of the detector from a low or high logic state to a low logic state. In some embodiments, only one detector can receive the input signal (e.g., token signal) per clock cycle. Therefore, only one detector can be reset to a low logic state per clock cycle.

At step 778, the method 770 includes storing data of a memory operation to a portion of an array of memory cells coupled to the detector in response to the detector changing from a low logic state to a high logic state. As stated previously, only one detector can be in a high logic state per clock cycle. The detector that is in a high logic state has detected a neutron strike.

At step 780, the method 770 can include outputting, by the detector an additional output signal corresponding to the high logic state of the detector. An additional detector can receive the additional output signal as an additional input signal. In some embodiments, the detector can receive the input signal during a first clock cycle and the additional detector can receive the additional input signal during a second clock cycle. The detector can receive a reset signal to change the detector from a high logic state to a low logic state during the second clock cycle.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An apparatus, comprising:
   a memory array;
   a detector array; and
   a detector coupled to the detector array, the detector configured to:
      detect an error in a portion of the detector array; and
      output an output signal to memory components coupled to the detector array in response to detecting the error, wherein:
         the output signal initiates a fuse broadcast in response to the detector detecting a neutron strike; and the output signal refrains from issuing a subsequent fuse broadcast in response to the detector detecting a subsequent neutron strike before the fuse broadcast is complete.

2. The apparatus of claim 1, wherein the detector array is a portion of a memory array.

3. The apparatus of claim 1, wherein the detector array is in a periphery of a memory array.

4. The apparatus of claim 1, wherein the memory components are additional detectors.

5. The apparatus of claim 4, wherein the detector and the additional detectors are located external to the array of memory cells.

6. The apparatus of claim 1, wherein the output signal is an input signal of an alert pin.

7. The apparatus of claim 1, wherein:
the output signal instructs the apparatus to execute a redundancy command; and
the redundancy command includes at least one of:
outputting an output signal to an alert pin;
initiating the fuse broadcast;
incrementing a counter; or
writing a register that is accessible to a host.

8. The apparatus of claim 1, wherein the detector includes a plurality of latches.

9. The apparatus of claim 1, wherein a neutron strike in a portion of the detector array indicates an uncorrectable error correction code (UECC) error event.

10. An apparatus, comprising:
a plurality of detector arrays;
a plurality of detectors coupled to the plurality of detector arrays, wherein each of the plurality of detectors comprises a latch; and
the plurality of detectors are configured to:
detect an error on a portion of the detector array; and
output an output signal in response to detecting the error, wherein:
the output signal initiates a fuse broadcast in response to the detector detecting a neutron strike; and
the output signal refrains from issuing a subsequent fuse broadcast in response to the detector detecting a subsequent neutron strike before the fuse broadcast is complete.

11. The apparatus of claim 10, wherein the plurality of detectors are coupled to each other via NOR gates, OR gates, or a combination thereof.

12. The apparatus of claim 10, wherein the latch of each detector comprises a plurality of transistors.

13. The apparatus of claim 12, wherein:
the error is caused by the neutron strike to a portion of the detector array; and
the plurality of transistors are configured to be more sensitive to the neutron strike than dual interlocked cell (DICE) latches.

14. The apparatus of claim 10, wherein the output signal is received by each of the plurality of detectors.

15. The apparatus of claim 10, wherein the apparatus includes an array of memory cells that include redundant memory cells.

16. A method, comprising:
outputting, by a detector, an output signal in response to detecting an error, wherein:
the output signal initiates a fuse broadcast in response to the detector detecting a neutron strike; and
the output signal refrains from issuing a subsequent fuse broadcast in response to the detector detecting a subsequent neutron strike before the fuse broadcast is complete;
changing, in response to detection of the neutron strike, a latched state of the detector, from a low logic state to a high logic state;
storing data of a memory operation to a portion of an array of memory cells coupled to the detector in response to the detector changing from the low logic state to the high logic state; and
outputting, by the detector, an additional output signal corresponding to the high logic state of the detector.

17. The method of claim 16, wherein the detector receives an input signal during a first clock cycle and an additional detector receives an additional input signal during a second clock cycle.

18. The method of claim 16, further comprising receiving, by the detector, a reset signal to change the detector from the high logic state to the low logic state, wherein subsequent detectors are serially reset during subsequent, individual clock cycles.

19. The method of claim 16, further comprising storing the data from the memory operation to the portion of the array of memory cells when the detector is in the high logic state while the data is being transferred to the array of memory cells via a data bus.

20. The method of claim 16, further comprising toggling an alert pin to alert a memory system of an error caused by the neutron strike to a detector array.

21. The method of claim 16, further comprising reading, by a host, a register to determine whether the neutron strike was detected.

22. The method of claim 16, further comprising incrementing a counter in response to detecting the neutron strike, wherein a host reads the counter to determine a number of neutron strikes that have occurred.

* * * * *